United States Patent
Natu et al.

(10) Patent No.: US 10,348,308 B2
(45) Date of Patent: Jul. 9, 2019

(54) CLOCK ARCHITECTURE, INCLUDING CLOCK MESH FABRIC, FOR FPGA, AND METHOD OF OPERATING SAME

(71) Applicant: Flex Logix Technologies, Inc., Mountain View, CA (US)

(72) Inventors: Nitish U. Natu, Santa Clara, CA (US); Abhijit M. Abhyankar, Sunnyvale, CA (US); Cheng C. Wang, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 16/009,656

(22) Filed: Jun. 15, 2018

(65) Prior Publication Data
US 2019/0007047 A1    Jan. 3, 2019

Related U.S. Application Data

(60) Provisional application No. 62/528,077, filed on Jul. 1, 2017.

(51) Int. Cl.
*H03K 19/177*    (2006.01)
(52) U.S. Cl.
CPC ... *H03K 19/1774* (2013.01); *H03K 19/17716* (2013.01); *H03K 19/17724* (2013.01); *H03K 19/17744* (2013.01)
(58) Field of Classification Search
CPC ............. H03K 19/173; H03K 19/1733; H03K 19/177; H03K 19/17716; H03K 19/17724; H03K 19/1774; H03K 19/17744; G06F 1/02; G06F 1/04; G06F 1/08; G06F 1/10
See application file for complete search history.

(56) References Cited

U.S. PATENT DOCUMENTS

| | | | |
|---|---|---|---|
| 5,682,107 A * | 10/1997 | Tavana | H03K 19/17704 326/39 |
| 5,933,023 A | 8/1999 | Young | |
| 6,028,463 A | 2/2000 | Albu et al. | |
| 6,094,066 A | 7/2000 | Mavis | |
| 6,204,689 B1 | 3/2001 | Percey et al. | |
| 6,211,695 B1 | 4/2001 | Agrawal | |
| 6,429,715 B1 | 8/2002 | Bapat et al. | |
| 6,671,865 B1 | 12/2003 | Ali et al. | |
| 6,718,477 B1 | 4/2004 | Plants et al. | |

(Continued)

*Primary Examiner* — Jason Crawford
(74) *Attorney, Agent, or Firm* — Neil A. Steinberg

(57) ABSTRACT

An integrated circuit comprising (i) an array of logic tiles wherein each logic tile is configurable to connect with at least one adjacent logic tile and (ii) a clock mesh fabric including a clock mesh to provide a mesh clock signal to each of the logic tiles of the array of logic tiles. In one embodiment, each logic tile of the array of logic tiles includes (1) distribution and transmission circuitry configurable to provide an associated tile clock to circuitry which performs operations using or based on the associated tile clock, wherein the distribution and transmission circuitry includes circuitry to generate a tile clock signal having a skew which is balanced with respect to the tile clock signals generated by the generation circuitry of each tile, and (2) selection circuitry to responsively output the associated tile clock which corresponds to the mesh clock signal or the tile clock signal.

16 Claims, 10 Drawing Sheets

(56) References Cited

U.S. PATENT DOCUMENTS

| | | | |
|---|---|---|---|
| 6,825,690 B1 | 11/2004 | Kundu | |
| 7,145,362 B1 | 12/2006 | Bergendahl et al. | |
| 7,430,728 B1 | 9/2008 | Rahut | |
| 7,729,415 B1 | 6/2010 | Possley | |
| 8,493,090 B1 | 7/2013 | Trimberger | |
| 9,240,791 B2 * | 1/2016 | Wang | G06F 1/08 |
| 9,496,876 B2 * | 11/2016 | Wang | G06F 1/08 |
| 9,882,568 B2 * | 1/2018 | Wang | G06F 1/08 |
| 10,027,433 B2 * | 7/2018 | Philip | G06F 1/04 |
| 2004/0010767 A1 | 1/2004 | Agrawal et al. | |
| 2004/0113655 A1 | 6/2004 | Curd et al. | |
| 2005/0050522 A1 | 3/2005 | Kami et al. | |
| 2007/0200594 A1 | 8/2007 | Levi et al. | |
| 2007/0273403 A1 | 11/2007 | Wang | |
| 2008/0061834 A1 | 3/2008 | Tetsukawa et al. | |
| 2008/0218202 A1 | 9/2008 | Arriens et al. | |
| 2008/0258761 A1 | 10/2008 | Hutchings et al. | |
| 2011/0012640 A1 | 1/2011 | Vorbach et al. | |
| 2011/0121366 A1 | 5/2011 | Or-Bach et al. | |
| 2012/0012895 A1 | 1/2012 | Or-Bach et al. | |
| 2012/0286822 A1 | 11/2012 | Madurawe | |
| 2015/0100756 A9 | 4/2015 | Vorbach et al. | |
| 2015/0333756 A1 | 11/2015 | Wang | |
| 2016/0246712 A1 | 8/2016 | Vucinic et al. | |
| 2016/0321081 A1 | 11/2016 | Kim et al. | |
| 2016/0342722 A1 | 11/2016 | Sentieys et al. | |
| 2018/0006653 A1 * | 1/2018 | Duong | G06F 1/08 |

\* cited by examiner

CLOCK ARCHITECTURE, INCLUDING CLOCK MESH FABRIC, FOR FPGA, AND METHOD OF OPERATING SAME

RELATED APPLICATION

This non-provisional application claims priority to and the benefit of U.S. Provisional Application No. 62/528,077, entitled "Clock Architecture, including Clock Mesh Fabric, for FPGA, and Method of Operating Same", filed Jul. 1, 2017. The '077 provisional application is incorporated herein by reference in its entirety.

INTRODUCTION

The present inventions are directed to circuitry of and techniques for clock signal distribution and transmission between logic tiles of an integrated circuit, for example, processors, controllers, state machines, gate arrays, programmable gate arrays (PGAs), field programmable gate arrays (FPGAs), and system-on-chips (SOCs). While the inventions and/or embodiments of the present inventions are often described below in the context of an FPGA, such discussion, inventions and/or embodiments are also applicable to programmable or configurable logic block, logic array block, or logic tile circuitry employed in processors, controllers, state machines, gate arrays, PGAs and SOCs. For the sake of brevity, a separate discussion for each and every integrated circuit is not provided; however the applicability will be clear to one of ordinary skill in the art based on the instant disclosure to, for example, processors, controllers, state machines, gate arrays, PGAs, FPGAs, and SOCs.

Briefly, an FPGA is an integrated circuit which may be configured and/or reconfigured (hereinafter, unless stated otherwise, collectively "configured" or the like (e.g., "configure", "configuring" and "configurable")) by, for example, a user, customer and/or a designer before, during and/or after manufacture. In one embodiment, the FPGA includes, among other things, a plurality of tiles having programmable components ("tiles" are often called "configurable logic blocks" (CLB), "logic array blocks" (LAB), or "logic tiles"—hereinafter collectively "logic tiles") and a network of configurable interconnects that facilitate communication between logic tiles as well as internally within logic tiles. Each logic tile has a plurality of inputs and outputs. The programmable interconnect are employed, for example, to connect the inputs and outputs of a logic tile to other logic tiles as well as to the FPGA's external inputs and outputs (which may connect to circuitry outside of the FPGA).

Each logic tile typically includes thousands of transistors which may be configured to perform combinational functions (simple and/or complex). The logic tiles may also include memory elements, for example, flip-flops, registers, blocks/arrays of memory or the like, and/or smaller logic tiles of any kind or type. The logic tiles often include circuitry to synchronize or align clock signals that facilitate orderly implementation of the functions or operations (for example, synchronously) of the logic tile and/or communication with, for example, other logic tiles and the FPGA's external inputs and outputs.

BRIEF DESCRIPTION OF THE DRAWINGS

The present inventions may be implemented in connection with embodiments illustrated in the attached drawings. These drawings show different aspects of the present inventions and, where appropriate, reference numerals or names illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIG. 6A illustrates, in block diagram form, an exemplary embodiment of clock selection circuitry of the clock distribution and transmission circuitry of a logic tile, according to at least one aspect of the present inventions, wherein, in operation, the clock selection circuitry receives a plurality of clock signals at the inputs (for example, one or more mesh clock signals and one or more delay matched clock signals that include appropriate or programmable skew relative to the tile clock signals of other logic tiles (e.g., substantially no or zero skew)), and FIG. 6B illustrates, in schematic form, clock selection circuitry implementing a clock select multiplexer to select one or more inputs to connect to the output.

Figure 1:
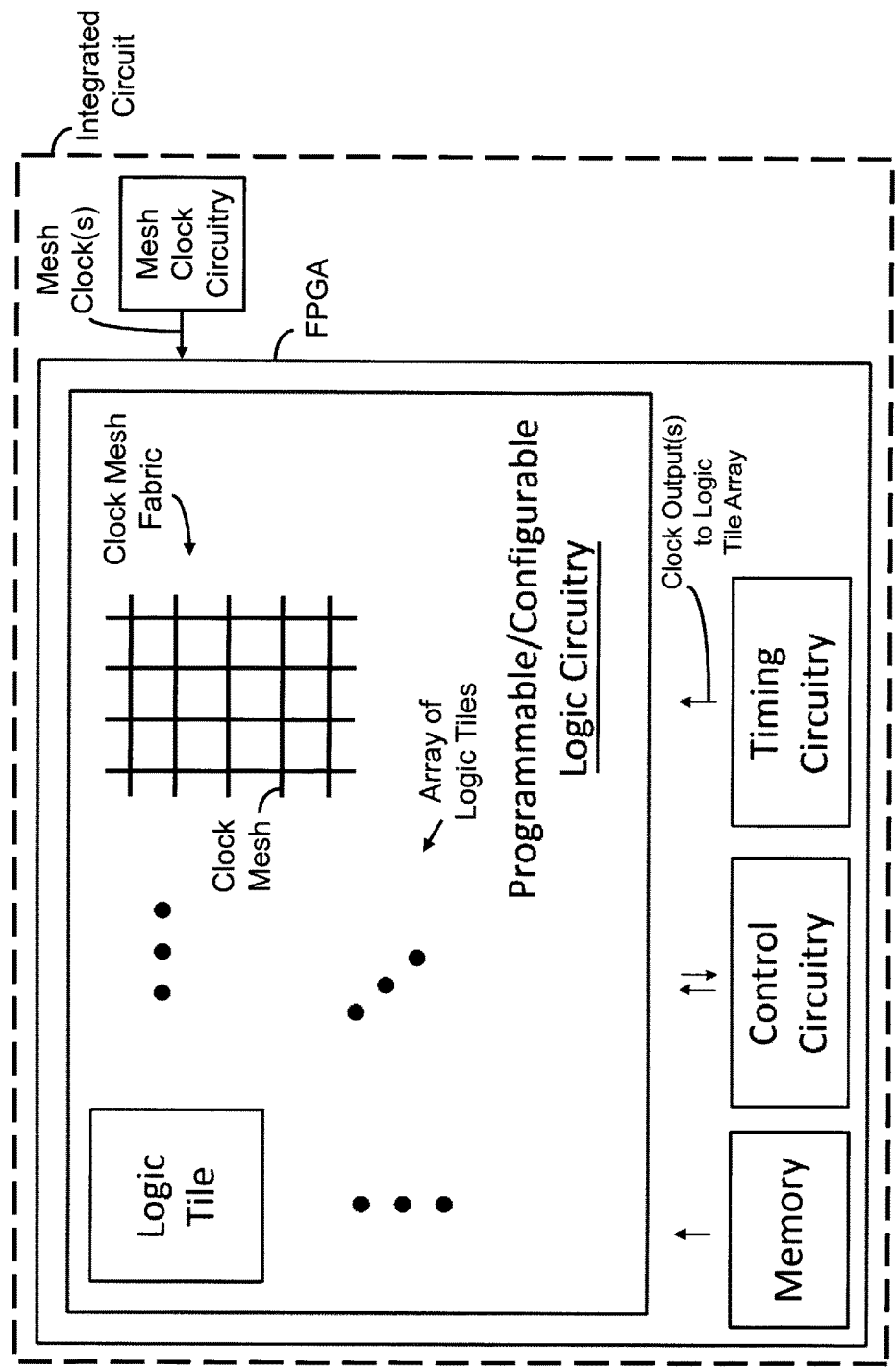
FIG. 1 illustrates a block diagram representation of, for example, an integrated circuit including control circuitry, clock/timing circuitry and programmable/configurable logic circuitry (which may include one or more logic tiles (each of which includes (i) logic transistors and (ii) clock distribution and transmission circuitry); in the illustrative embodiment, the clock/timing circuitry is disposed "on-chip", for example, clock/timing circuitry fabricated or integrated in/on the die of the integrated circuit generates one or more of the clock signals (the same clock signal or a derivative thereof) and outputs the clock signal(s) to the programmable/configurable logic circuitry (and the array of logic tiles thereof); the programmable/configurable logic circuitry of the present inventions includes a clock mesh of a clock mesh fabric to distribute one or more mesh clocks to one or more (or all) of the logic tiles of the array; in one embodiment, one or more (or all) of logic tiles of the array of logic tiles of the programmable/configurable logic circuitry receive the one or more mesh clocks (via the clock mesh of the clock mesh fabric) as well as clock signals from the timing circuitry of the FPGA wherein, in one embodiment, circuitry in the logic tile responsively provides either the mesh clock or an internally generated/derived clock(s) to circuitry of the logic tile that, for example, performs or execute, functions and/or operations; notably, in one embodiment, the internally generated/derived clock(s) may be generated using any circuitry or technique now known or later developed including, for example, those as described/illustrated in U.S. Pat. No. 9,240,791, U.S. Provisional Patent Application No. 62/518,699 and/or U.S. Non-Provisional patent application Ser. No. 15/996,430 (all of which are incorporated herein by reference); notably, the circuitry to generate the mesh clock(s) as well as other clock/timing circuitry may be partially or entirely off-chip (i.e., external to the die of the integrated circuit)

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

In one aspect, the present inventions relate to circuitry for and methods of using, providing, distributing, generating and/or transmitting clock signals in and/or between logic tiles of an array of logic tiles of integrated circuits, for example, processors, controllers, state machines, gate arrays, PGAs, FPGAs, and SOCs. The architectures, circuitry and techniques of the present inventions, in one embodiment, distribute and/or transmit a plurality of input clock signals, including (i) one or more mesh clock signals which is/are provided, distributed and/or transmitted to a plurality (or all) of the logic tiles of the array of logic tiles via a clock mesh of a clock mesh fabric and (ii) a clock signal which is applied or input in one or more (or all) of the logic tile(s), for example, one or more inputs into logic tile(s) that is/are located on or form a perimeter or periphery of the logic tile array which is/are thereafter distributed and/or transmitted in and/or between logic tiles of the array of an integrated circuit to generate one or more tile clocks within each of the logic tiles. The tile clock of each logic tile includes a desired or programmable skew relative to the tile clocks of other logic tiles of the programmable/configurable logic circuitry of the integrated circuit and is employed by circuitry in the associated logic tile to perform operations therein (e.g., memory, logic functions, etc.). For example, in one embodiment, the array of logic tiles may receive a mesh clock signal which is distributed to each of the logic tiles of the array (or a subset thereof) via the clock mesh of a clock mesh fabric. In addition, the array of logic tiles may receive a plurality of clock signals (having the same characteristics—e.g., phase and frequency) at a plurality of logic tiles which is thereafter distributed and/or transmitted to neighboring logic tiles wherein clock generation circuitry of the clock distribution and transmission circuitry of the logic tiles facilitate or implement delay matching of the clock signals transmitted or distributed from logic tile to logic tile to align or balance such signals and thereby provide, generate and/or include a predetermined skew (e.g., zero or substantially zero) relative to the tile clocks of other logic tiles.

The use or implementation of one or more of the clock signals within each of the logic tiles may be determined via configuration data (for example, at start-up or initialization), in situ (during operation) and/or dynamically by control circuitry. For example, control signals may be provided to one or more (or all) of the logic tiles of the array which determine the use (if at all) of the clock signals. Such control signals may be stored in memory and applied to one or more (or all) of the logic tiles during configuration of the of the logic tiles (for example, at start-up, initialization or reset). In addition, such control signals may be generated by control circuitry (in a logic tile of the array, in the associated logic tile, or external to the array (e.g., external to the programmable/configurable logic circuitry or entirely off-chip and thereby external to the die of the integrated circuit) and applied to selected/appropriate (or all of) logic tiles to control the use of the clock signals (for example, the mesh clock signal) by circuitry in the logic tile, for example, in connection with implementation of functions or operations of the logic tile and/or communication with other logic tiles and external inputs and outputs.

Notably, the mesh clock signal may be a high speed clock relative to other clocks (for example, all other clocks) used, received, transmitted and/or distributed by/to the logic tiles—including the internally generated clock signal(s). For example, in one embodiment, the mesh clock includes a frequency of greater than 1 GHz and the other clocks include a frequency of less than 1 GHz.

In one embodiment, the mesh clock signal is generated by mesh clock circuitry (which may be on chip (i.e., on the die of the integrated circuit) or partially or entirely off-chip (i.e., external to the die of the integrated circuit)). Thereafter the mesh clock is provided to the clock mesh of the clock mesh fabric which distributes or transmits the mesh clock signal to one or more or all of the logic tiles of the array.

As mentioned above, in one embodiment, the logic tiles of the array generate and/or distribute another clock signal which is synchronous and has substantially no or zero skew and/or phase difference relative to the clock signals generated and employed in or by other logic tiles of the array of logic tiles of the integrated circuit. For example, as discussed in detail in U.S. Pat. No. 9,240,791, U.S. Provisional Patent Application No. 62/518,699 and/or U.S. Non-Provisional patent application Ser. No. 15/996,430 (which, as indicated above, are incorporated by reference herein), a clock signal may be input to one or more logic tiles and thereafter distributed and/or transmitted to neighboring logic tiles of/in an associated row and/or column of the array of logic tiles. The circuitry in the clock distribution and transmission circuitry of each logic tile implements delay matching of the clock signal transmitted or distributed from logic tile to logic tile, to balance the tile clock relative to other tile clocks associated with other logic tiles. In this embodiment, each logic tile of the array receives and/or generates a clock signal having a predetermined skew relative to the clock signals of other logic tiles (for example, synchronous and substantially no or zero skew and/or phase difference relative to the clock signals generated and employed in or by other logic tiles of the array of logic tiles of the integrated circuit) to provide a local clock signals (i.e., tile clocks) which may be employed by circuitry in the associated logic tile to perform functions or operations (e.g., communication with other logic tiles and external inputs and outputs).

For example, as discussed in U.S. Provisional Patent Application No. 62/518,699 and U.S. Non-Provisional patent application Ser. No. 15/996,430 (which, as mentioned above, are incorporated by reference herein), a plurality of logic tiles located, for example, on two or more (or all) of the perimeters of an array of logic tiles of the array receive the same clock signal, and distribute and/or transmit the clock signal to neighboring logic tiles of/in an associated row and/or column of the array of logic tiles. The circuitry in the clock distribution and transmission circuitry of each logic tile implement delay matching of the clock signal transmitted or distributed from logic tile to logic tile, such that each logic tile of the array receives and/or generates a clock signal having a predetermined skew relative to the clock signals of other logic tiles (for example, synchronous and substantially no or zero skew and/or phase difference relative to the clock signals generated and employed in or by other logic tiles of the array of logic tiles of the integrated circuit). In one embodiment, control circuitry determines which clock signal(s) to employ as a local clock signals (i.e., tile clocks) and/or when to employ such clock signal(s). As mentioned above, the local clock signals (i.e., tile clocks) may be employed by selected and/or all circuitry in the logic tile to facilitate implementation of functions or operations of the logic tile and/or communication with other logic tiles and external inputs and outputs.

In one embodiment, the array of logic tiles may be configured to concurrently employ multiple clock signals. For example, a first portion of the array of logic tiles may employ a mesh clock signal and a second portion of the array of logic tiles may employ an internally generated clock signal (for example, a clock signal that is delay matched across or among a plurality of logic tiles (as discussed above)). Notably, each of the first and second portions (or in embodiments having more than two portions of the array of logic tiles) may consist of one or more logic tiles.

Figure 2A:
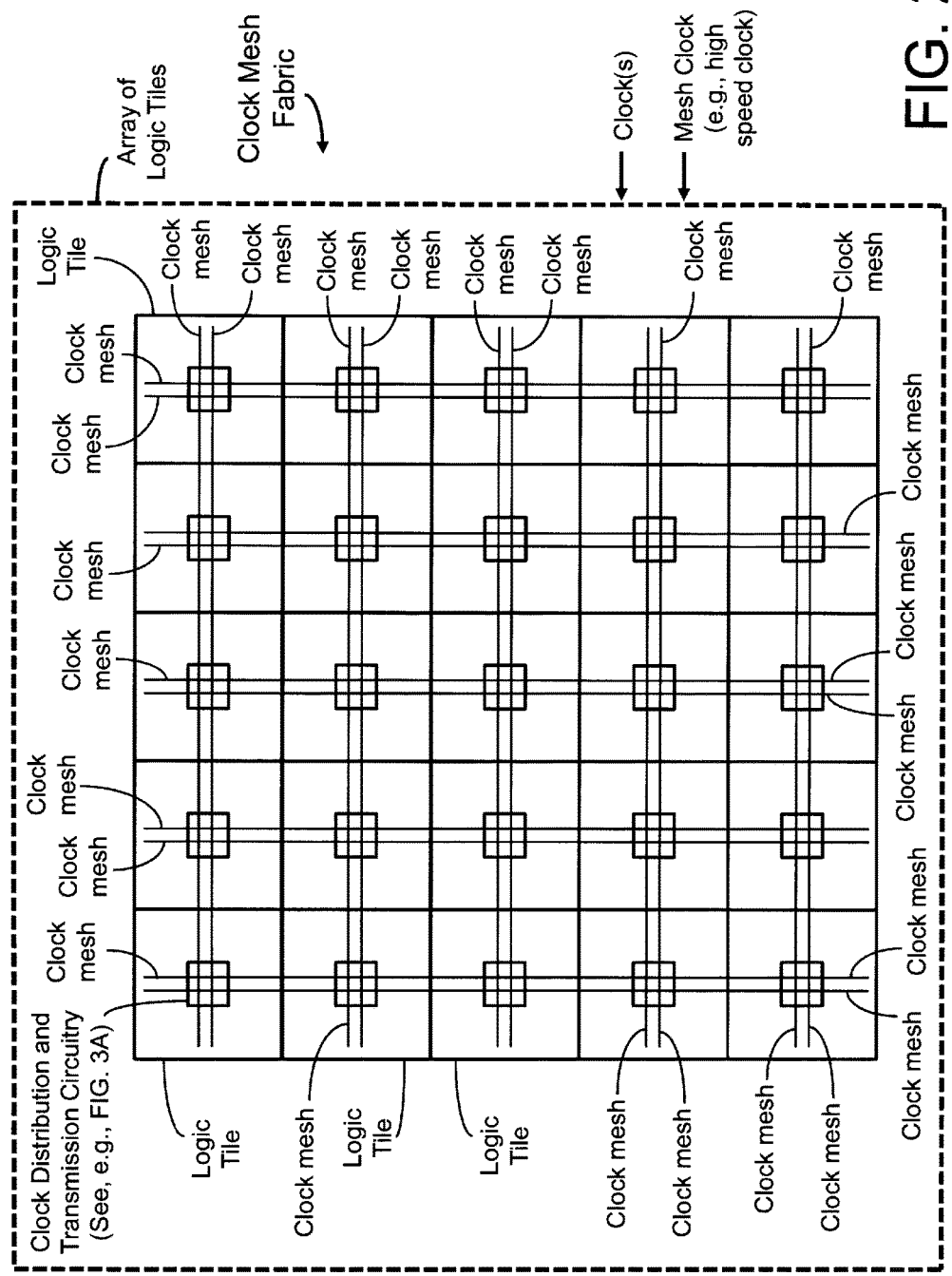
FIG. 2A illustrates a block diagram representation of a plurality of interconnected logic tiles of a 5×5 array of logic tiles of exemplary programmable/configurable logic circuitry of, for example, an FPGA, according to at least one aspect of the present inventions, wherein, in this exemplary embodiment, a clock mesh fabric is incorporated or integrated into the array of logic tiles wherein the mesh clock signal is provided to each of the logic tiles of the array via the clock mesh; notably, the array of logic tiles also receives one or more additional clock signals wherein, in one embodiment, each logic tile generates tile clock signals therefrom having known characteristics (for example, frequency and phase) relative to the other tile clock signal(s); in one embodiment, the logic tiles internally generate/derive one or more clocks using the circuitry and any techniques described/illustrated in U.S. Pat. No. 9,240,791, U.S. Provisional Patent Application No. 62/518,699 and/or U.S. Non-Provisional patent application Ser. No. 15/996,430; notably, in one embodiment, each logic tile of the array includes clock distribution and transmission circuitry (illustrated by the block disposed within each logic tile block) which is capable of distributing the clock signal to one or more neighboring logic tiles and configured to generate a clock signal having a characteristics which, in one embodiment, correlates to (for example, includes same frequency and phase) the clock signals of the other Logic Tiles; as noted above, the tile clock signal, in one embodiment, is employed to generate a tile clock (see, for example, FIGS. 3A-3C and 5)
Figure 2B:
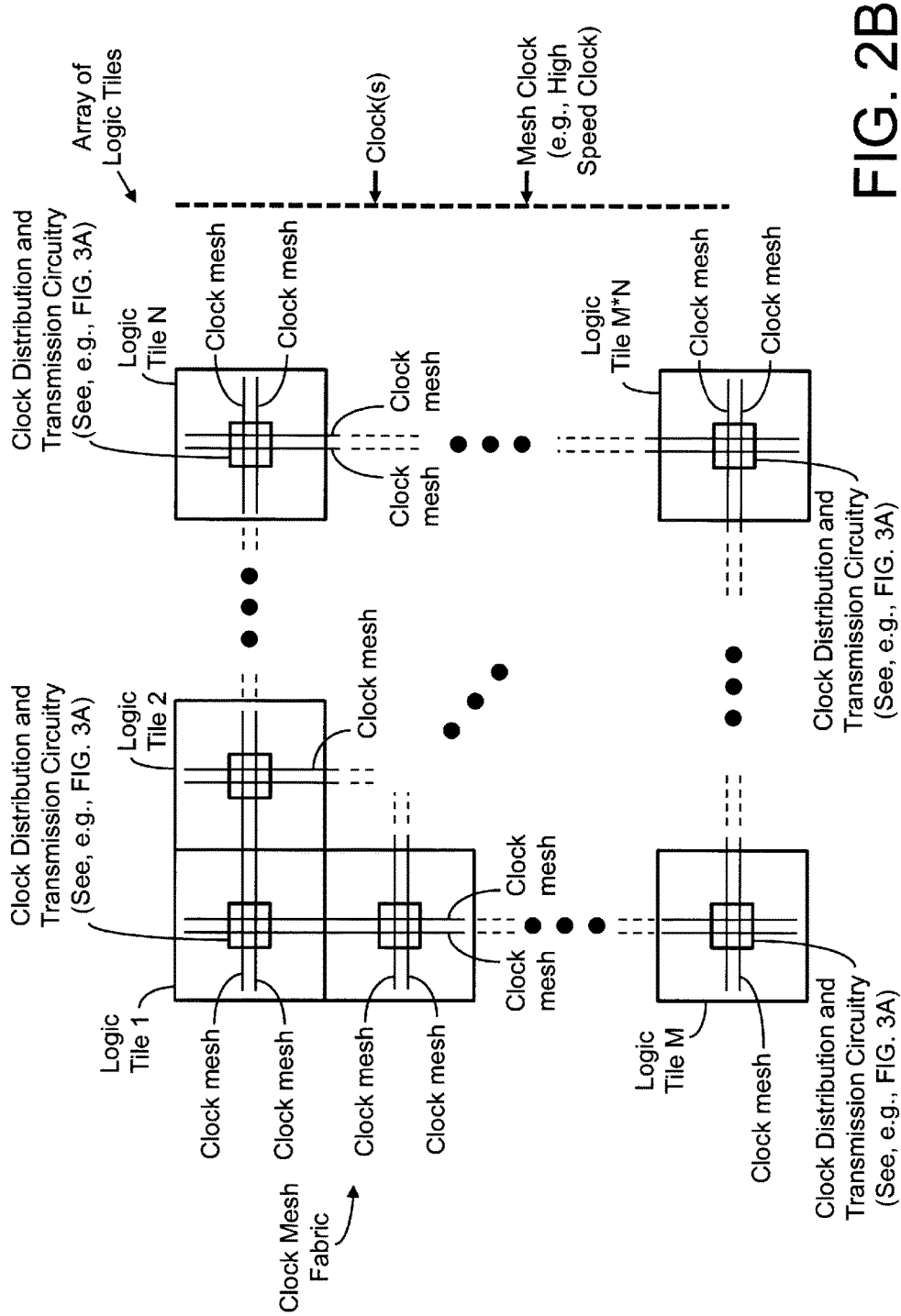
FIG. 2B illustrates a block diagram representation of a plurality of interconnected logic tiles of a M×N array of logic tiles of exemplary programmable/configurable logic circuitry, for example, of an FPGA, according to at least one aspect of the present inventions, wherein, in this embodiment, a clock mesh fabric is incorporated or integrated into the array of logic tiles to distribute, transmit or provide one or more mesh clock signals to the logic tiles; the array of logic tiles of this embodiment also includes one or more clock signal inputs to receive one or more clocks; such clock signal inputs may receive the same clock signal and may be applied to different logic tiles of the array (see, for example, U.S. Provisional Patent Application No. 62/518,699 and U.S. Non-Provisional patent application Ser. No. 15/996, 430) to generate a tile clock signal(i.e., a local clock for the associated logic tile wherein that tile clock signal includes a desired, appropriate or programmable skew relative to the tile clock signals of other logic tiles); notably, each logic tile of the array includes clock distribution and transmission circuitry (illustrated by the block disposed within each logic tile block) which is capable of responsively selecting between the clock signals (i.e., clock mesh or other clocks) to provide to the circuitry of the logic tile to, for example, implement functions or operations of the associated logic tile and/or synchronize communication with other logic tiles and/or the external inputs and outputs of the programmable/configurable logic circuitry.

With reference to FIGS. 1, 2A and 2B, in one embodiment, the integrated circuit includes control circuitry, clock circuitry and programmable/configurable logic circuitry which includes an array of logic tiles. A clock mesh fabric is included to transmit and distribute one or more mesh clock signals to the logic tiles of the array. Each of the logic tiles may include logic circuitry/transistors (not illustrated) and/or memory circuitry/transistors (not illustrated) and clock distribution and transmission circuitry which is configurable to, among other things, responsively generate and/or select one or more tile clock signals to be employed by circuitry of the logic tile. In one embodiment, the tile clock(s) is the mesh clock signal and in another embodiment, the tile clock(s) is another clock—for example a delay matched clock signal having a desired or programmable skew (for example, substantially no or zero skew) and/or phase (for example, 0 degrees or 180 degrees) relative to the tile clock signal(s) of other logic tiles of the programmable/configurable logic circuitry (see, for example, U.S. Pat. No. 9,240,791, U.S. Provisional Patent Application No. 62/518,699 and/or U.S. Non-Provisional patent application Ser. No. 15/996,430).

With reference to FIGS. 1, 2A, 2B and 3A, in one embodiment, the clock distribution and transmission circuitry of a logic tile of the array of logic tiles includes circuitry (i) to receive one or more delay matched tile clock signal(s) and (ii) a mesh clock signal via the clock mesh of the clock mesh fabric. In one embodiment, the circuitry includes clock selection circuitry (e.g., one or more clock select multiplexers—see FIG. 3A) to selectively and responsively output one of signals for use as a local clock signal (i.e., Tile Clock) in the associated logic tile in performance or connection with one or more functions/operations implemented by one or more logic tiles. By selectively controlling the clock select multiplexer(s), the logic tile employs one or more clock signals (for example, the mesh clock signal) in lieu of other available clock signals. In one embodiment, the clock select multiplexers responsively output either the mesh clock signal or an internally generated/derived clock signal (for example, the delay matched clock signal) as a tile clock which is used by the circuitry of the logic tile to perform or execute, for example, functions and/or operations. Notably, in one embodiment, the clock select multiplexers are separately/individually controlled relative to other clock select multiplexers in the logic tile or logic tiles (e.g., via separate select/control signals applied to one or more of the clock select multiplexers); in another embodiment, the clock select multiplexers of a logic tile or logic tiles are controlled as a group (e.g., via one select/control signal).

In one embodiment, control circuitry determines the use of a particular clock signal within a given logic tile on a tile-by-tile basis. That is, one or more logic tiles may employ the internally generated tile clock (based on, for example, a delay matched clock signal) and one or more other logic tiles may employ the mesh clock signal that is provided to the logic tiles via the clock mesh of the clock mesh fabric. The control circuitry may separately and/or individually (on a logic tile by logic tile basis) enable use of the mesh clock signal (in lieu of other clock signals), via control of such clock select multiplexer(s), within one or more logic tiles—for example, in connection with one or more functions/operations implemented by such one or more logic tiles. For example, control circuitry may apply control signals to (i) the clock selection circuitry (e.g., clock select multiplexers) associated with or of a first group of one or more logic tiles to responsively output and employ the mesh clock in a first group of one or more logic tiles and (i) the clock selection circuitry (e.g., clock select multiplexers) associated with or of a second group of one or more logic tiles to responsively output and employ the internally generated tile clock (based on, for example, a delay matched clock signal) in a second group of one or more logic tiles. Indeed, in one embodiment, the control circuitry may separately or individually control the clock selection circuitry (e.g., clock select multiplexers via applying different input select signals to the multiplexers within the given logic tile) in the logic tile in order to facilitate implementation or use of more than one clock signal within the logic tile.

In yet another embodiment, the control circuitry (which may include or be memory which, for example, stores data which is representative of the control signals) may apply control signals to the clock select multiplexers associated with all of the logic tiles to responsively output and employ (i) the mesh clock signal in a first group of one or more logic tiles or (ii) the internally generated tile clock (based on, for example, a delay matched clock signal). Notably, such control signals may be stored in memory and applied to one or more of the clock selection circuitry (e.g., clock select multiplexers) during configuration or re-configuration of the associated logic tiles (for example, at start-up/initialization). In one embodiment, control of the clock select multiplexers is fixed for a given configuration of the logic tiles of the array of logic tiles (i.e., until such logic tiles are re-configured). In another embodiment, the control signals may be modified in situ (i.e., during operation of the FPGA or integrated circuit). For example, the clock signal employed by one or more logic tiles (or circuitry within one or more logic tiles) may change during operation, for example, based on performance or execution of functions, operations and/or communication of such one or more logic tiles.

Figure 6A:
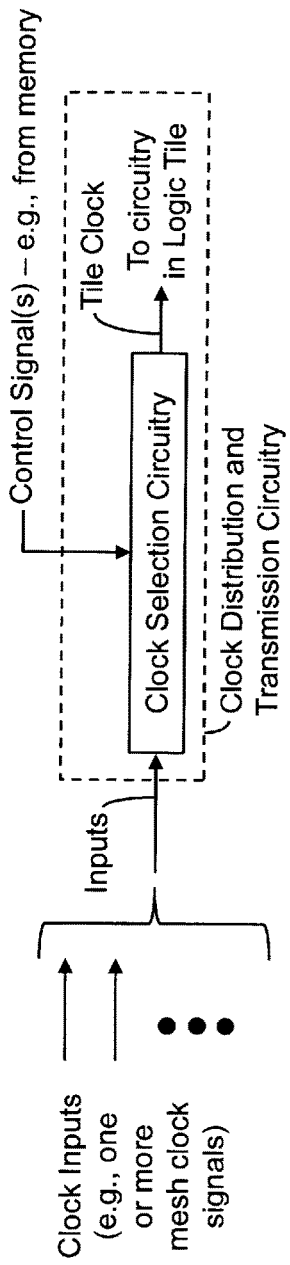
FIGS. 6A and 6B illustrates, in block diagram and schematic forms, exemplary embodiments of clock selection circuitry according to at least one aspect of the present inventions; in particular.
Figure 6B:
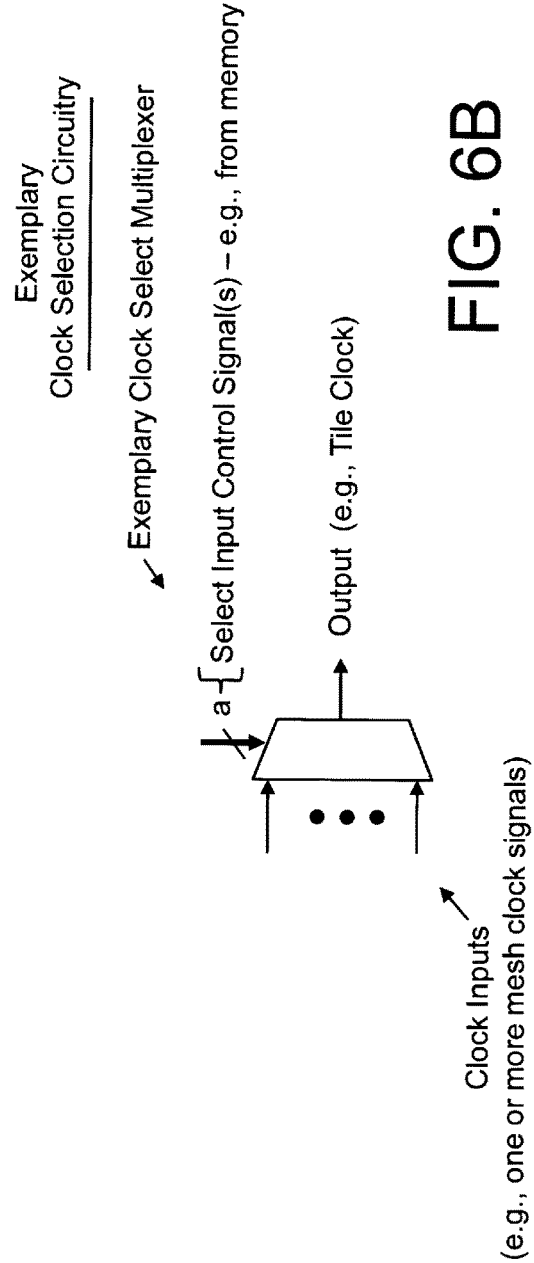

Notably, where the data states of the control signals are stored in memory, such data of the control signals may be fixed (start-up/initialization) or dynamic (modifiable after start-up/initialization). Here, the control circuitry includes memory that stores the data state(s) of the control signals. With reference to FIG. 6A, in one embodiment, the data state(s) stored in memory may then be read and applied as control signals to the clock selection circuitry (which, in one embodiment, is embodiment is or includes one or more clock select multiplexers—see, e.g., FIG. 6B) to implement use of one or more particular tile clock (local clock signal) within the associated logic tile.

As noted above, the use or implementation of one or more of the clock signals within each of the logic tiles may be determined via configuration data (for example, at start-up or initialization), in situ (during operation) and/or dynamically by control circuitry. For example, control signals may be provided to the clock selection circuitry of one or more (or all) of the logic tiles of the array which determine the use (if at all) of the clock signals. Such control signals may be stored in memory and applied to the clock selection circuitry (e.g., the clock select multiplexer) of one or more (or all) of the logic tiles during configuration of the of the logic tiles (for example, at start-up, initialization or reset). In addition, such control signals may be generated by control circuitry (in a logic tile of the array, in the associated logic tile, or external to the array (e.g., external to the programmable/configurable logic circuitry or entirely off-chip and thereby external to the die of the integrated circuit) and applied to the clock selection circuitry of certain (or all of) logic tiles to determine and/or control the use or implementation of the clock signals (for example, the mesh clock signal) by circuitry in the logic tile, for example, in connection with implementation of functions or operations of the logic tile and/or communication with other logic tiles and external inputs and outputs.

Figure 4A:
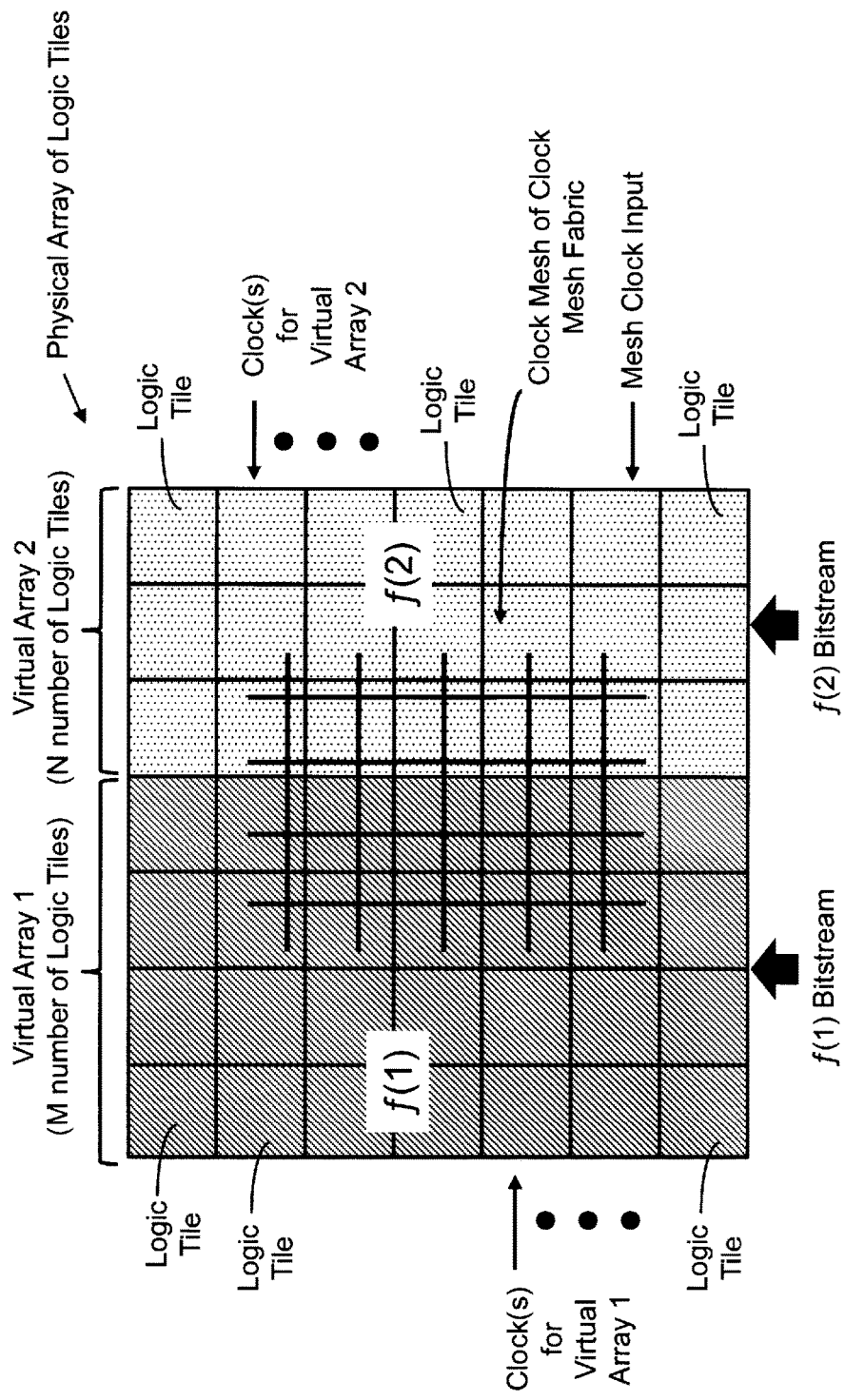
FIGS. 4A and 4B illustrate, in block diagram form, exemplary embodiments of a physical array of a plurality of logic tiles arranged into a plurality of virtual arrays (in the illustrated embodiment, two virtual arrays), as described in U.S. Provisional Patent Application No. 62/511,739 and U.S. patent application Ser. No. 15/975,037 (which are incorporated herein by reference), wherein in this illustrative exemplary embodiment, the physical array of a plurality of logic tiles is arranged into (i) a first virtual array of logic tiles (having M logic tiles where M is a positive integer) which is programmed/configured/defined to implement a first function/operation $f(1)$, and (ii) a second virtual array of the logic tiles (having N logic tiles where N is a positive integer) which is programmed/configured/defined to implement a second function/operation $f(2)$; in one embodiment, each virtual array receives one or more clock signal(s) as well as a mesh clock signal which may be distributed to each of the logic tiles and employed by the logic tiles to perform various functions/operations (see FIG. 4A); in another embodiment, less than all of the logic tiles receive the mesh clock signal—for example, only one of the virtual arrays (i.e., less than all of the logic tiles and/or virtual arrays where the physical array of logic tiles is virtually partitioned into more than two virtual arrays) receives the mesh clock signal (see FIG. 4B wherein a subset of the logic tiles receives the mesh clock signal); notably, control circuitry may implement or enable use of the mesh clock signal (in lieu of other clock signals) within one or more physical logic tiles and/or within one or both of the virtual arrays, for example, in connection with one or more functions/operations implemented by such one or more virtual arrays of logic tiles; the control circuitry may control/establish the clock domain at start-up or initialization (for example, via the data state of memory employed to set/control/establish the clock domain) and/or dynamically during normal operation of the FPGA or integrated circuit.
Figure 4B:
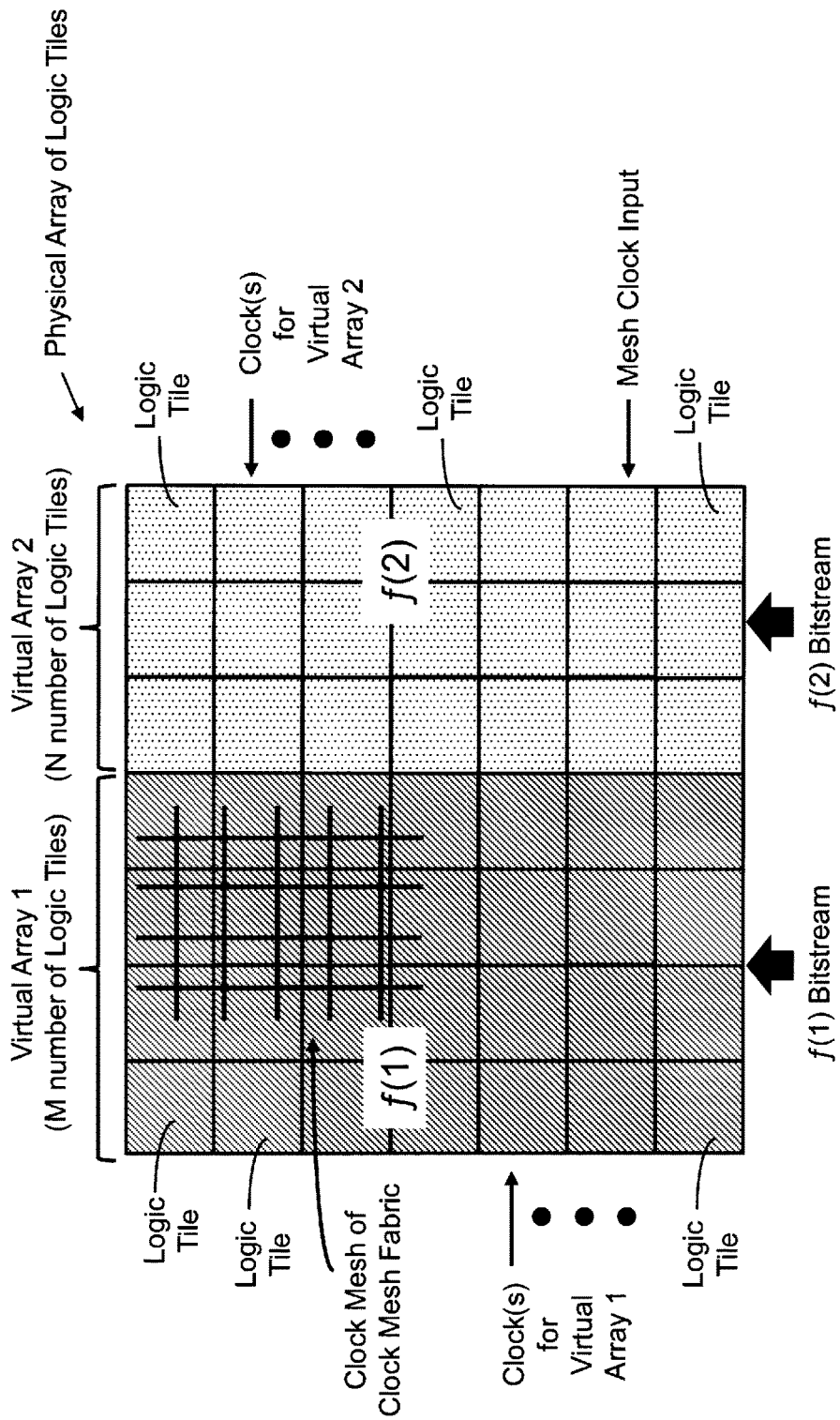

In another embodiment, the physical array of logic tiles includes one or more virtual arrays as described and/or illustrated in U.S. Provisional Patent Application No. 62/511,739 and/or U.S. Non-Provisional patent application Ser. No. 15/975,037, which is incorporated by reference herein. Here, circuitry that controls the clock selection circuitry (e.g., clock select multiplexers) of the logic tiles may implement one or more clock domains for one or more portions of the one or more physical logic tiles and/or within one or more of the virtual arrays, for example, in connection with one or more functions/operations implemented by such one or more virtual arrays of logic tiles. For example, with reference to FIGS. 4A and 4B and as discussed in detail in U.S. Provisional Patent Application No. 62/511,739 and/or U.S. Non-Provisional patent application Ser. No. 15/975, 037, the physical array of a plurality of logic tiles may be arranged into a plurality of virtual arrays—in the illustrative example, two virtual arrays (i.e., Virtual Array 1 and Virtual Array 2). One or both virtual arrays may receive one or more of the same or different clock signal(s) as well as a mesh clock signal which may be distributed (via the clock mesh of the clock mesh fabric) to each of the logic tiles and employed by the logic tiles to perform various functions/operations. In one embodiment, control circuitry may enable use of the mesh clock signal (in lieu of other clock signals) within one or more physical logic tiles of the virtual arrays. In addition thereto or in lieu thereof, control circuitry may enable use of the mesh clock signal (in lieu of other clock signals) within one or more physical logic tiles of the virtual arrays in connection with one or more functions/operations implemented by one or more virtual arrays of logic tiles.

Here, the control circuitry (in one embodiment, via control of the clock selection circuitry (e.g., clock select multiplexers) in the logic tiles) may implement use of the mesh clock signal (in lieu of other clock signals) in one or more (or all) logic tiles of Virtual Array 1 and/or the internally generated tile clock (based on, for example, a delay matched clock signal) in one or more (or all) logic tiles of Virtual Array 2. All permutations and combinations of architectures and implementations of the clock mesh and clock distribution and transmission (and use of mesh clock signal and/or internally generated tile clock signals) are intended to fall within the scope of the present inventions; for the sake of brevity, all such permutations and combinations are not individually discussed and/or illustrated herein.

Notably, the present inventions may be implemented in those embodiments where the physical array of logic tiles is functionally and/or operationally "partitioned" to provide or form more than two virtual arrays. The number of logic tiles in each of the virtual arrays of the physical array may be the same as or different from other virtual arrays of the physical array of logic tiles of the FPGA. Again, all permutations and combinations of architectures and implementations of the clock mesh and clock distribution and transmission (and use of mesh clock signal and/or internally generated tile clock signals) are intended to fall within the scope of the present inventions where; for the sake of brevity, all such permutations and combinations are not individually discussed and/or illustrated herein As noted above, the clock domain used in a given logic tile or group of logic tiles (for example, logic tiles of a particular virtual array) may be determined at or during configuration of the FPGA (for example, at start-up, initialization or re-initialization via programming memory with the appropriate data to set/control/establish the selected clock domain—for example, the mesh clock domain). The control signals (which define the clock domain of the logic tile or group of logic tiles) may be fixed for a particular configuration of the logic tiles of the FPGA during normal operation of the FPGA or integrated circuit. Alternatively, such control signals may be dynamic during normal operation of the FPGA or integrated circuit.

In another embodiment, the same clock domain may be defined for all of the logic tiles of the array of logic tiles. Here, the clock selection circuitry (which, in one embodiment, includes clock select multiplexers in one exemplary embodiment) in or of all of the logic tiles of the array may receive the same control information/data or signal(s) such that each logic tile employs the same clock signal to perform or execute, for example, functions, operations and/or communication.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, in one embodiment, the array of a plurality of logic tiles receives one or more different and/or separate clock signal(s) (as described above) as well as a mesh clock signal (via a clock mesh architecture) which may be distributed to each of the logic tiles and employed by the logic tiles to perform various functions/operations. Control circuitry may select, control or enable use of the mesh clock signal (in lieu of other clock signals) within one or more (or all) logic tiles of the array and/or in connection with one or more functions/operations implemented by one or more logic tiles (for example, certain circuitry in a logic tile(s) may receive and employ the mesh clock signal and other circuitry in the logic tile(s) may receive and employ another clock signal).

Figure 3A:
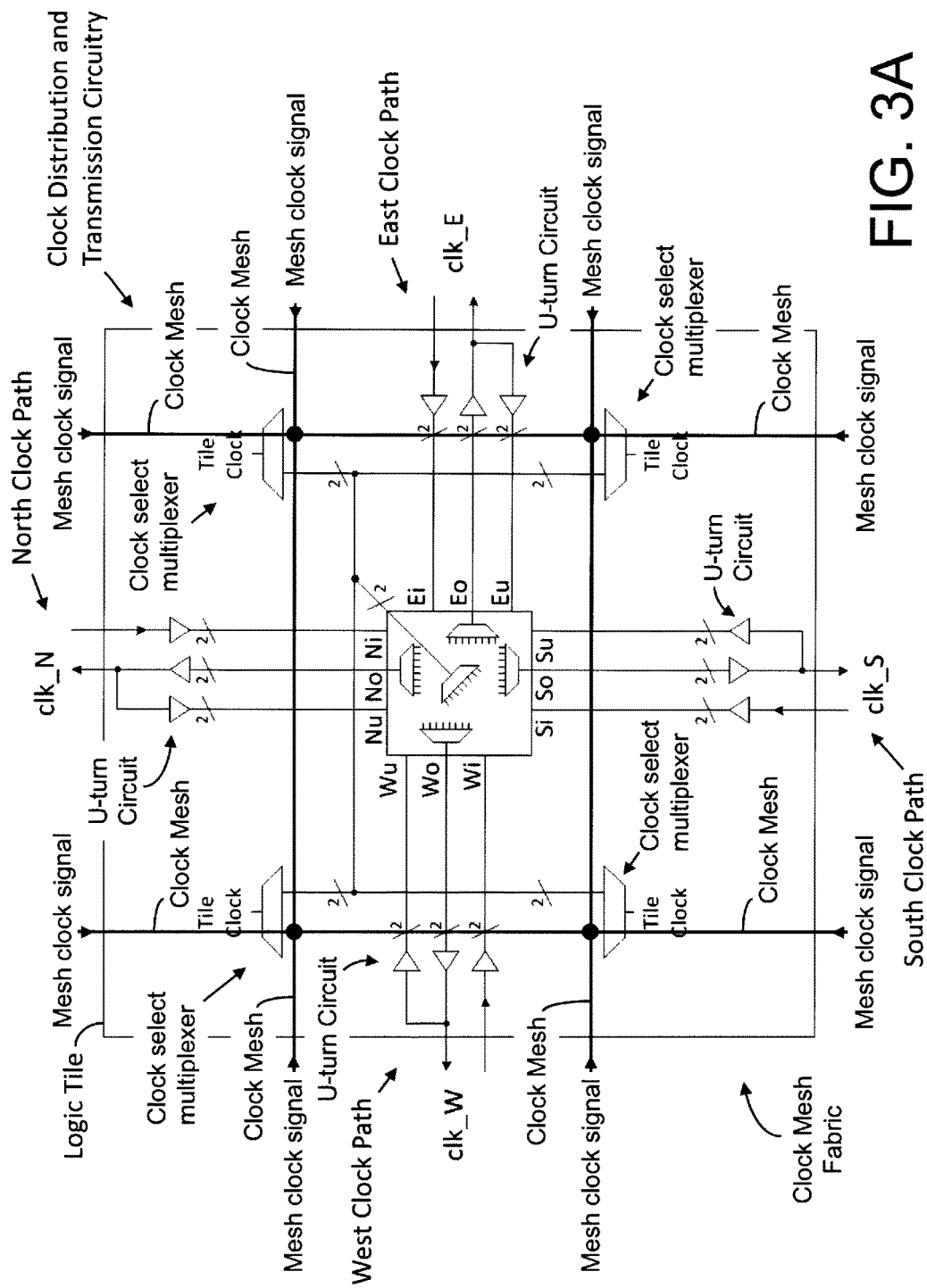
FIG. 3A illustrates, in a schematic block diagram form, an exemplary embodiment of clock distribution and transmission circuitry of a logic tile of the array of logic tiles according to at least one aspect of the present inventions, wherein the clock distribution and transmission circuitry, in this embodiment, includes clock generation circuitry to generate one or more tile clock signals having a desired or programmable skew and clock selection circuitry to receive the one or more tile clock signals and one or more mesh clock signals (via a clock mesh of the clock mesh fabric (for transmitting a mesh clock signal to the logic tile)) and to select a clock signal to be employed (via circuitry that perform operations based thereon) in the logic tile; in one exemplary embodiment, the clock selection circuitry includes clock select multiplexer(s) which receives the tile clock signals and the mesh clock signal (and any other clock signals); the desired clock signal may be available to the circuitry of the logic tile (to, for example, implement operations therein (e.g., memory, functions, etc.) via selectively enabling one of the clock inputs to the clock select multiplexer(s) to connect the selected input to the output of the clock select multiplexer(s); such clock select multiplexers, in this embodiment, responsively output either the mesh clock signal or an internally generated/derived clock signal (that is delay matched to the other logic tiles of the array) as a tile clock which is used by the circuitry of the logic tile to perform or execute, for example, functions and/or operations; control circuitry (e.g., in the logic tile and/or outside of the logic tile array—see "Control Circuitry" in FIG. 1) may enable use of the mesh clock signal (in lieu of other clock signals), via control of such multiplexer(s); in this exemplary embodiment the clock generation circuitry of the clock distribution and transmission circuitry, includes a plurality of input and output paths (four paths in this illustrated embodiment—labeled "north clock path", "east clock path", "south clock path" and "west clock path") to generate one or more tile clock signals having a desired or programmable skew)
Figure 3B:
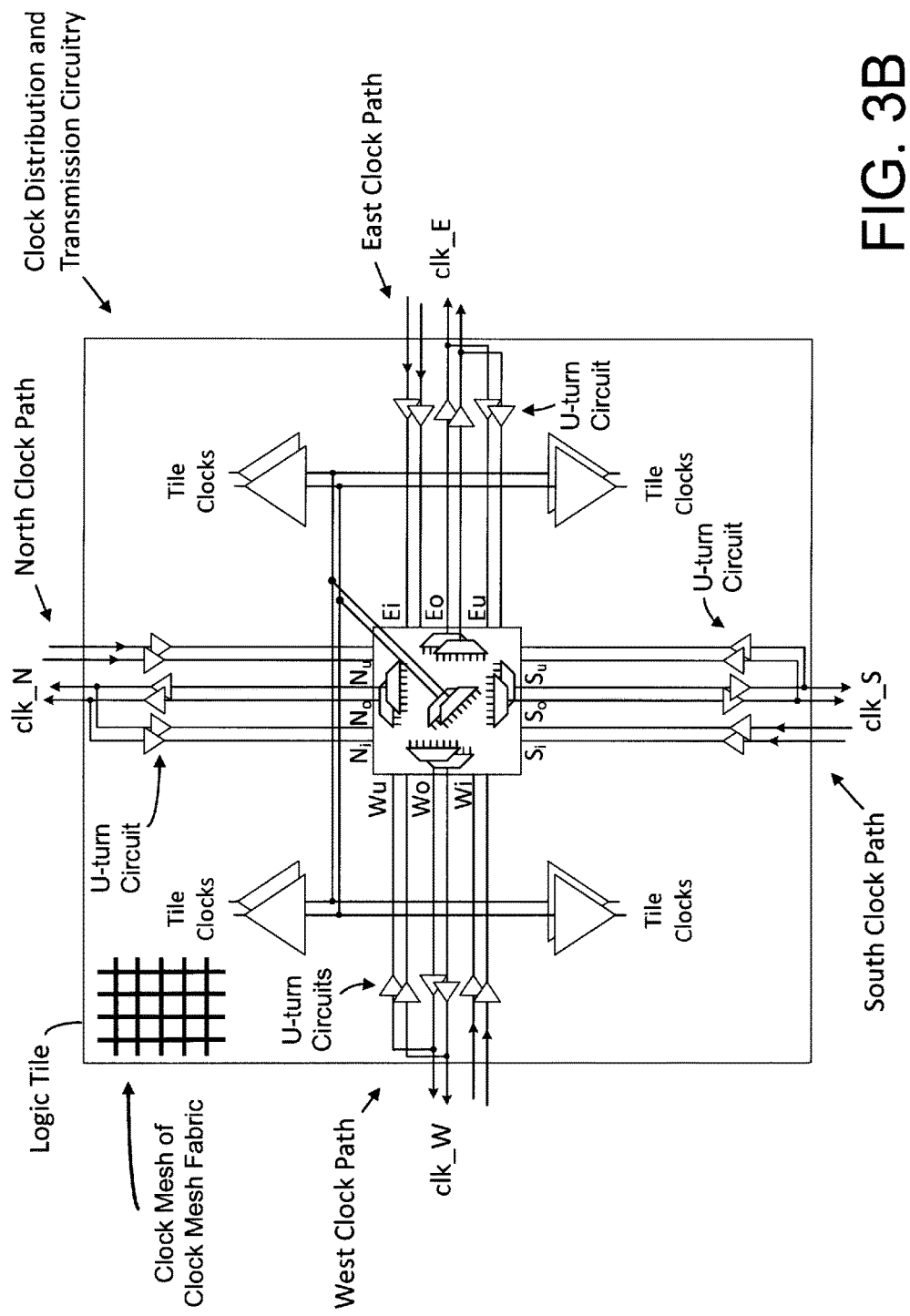
FIGS. 3B and 3C illustrate, in a schematic block diagram form, exemplary embodiments of clock distribution and transmission circuitry of a logic tile wherein in these exemplary embodiments, although not illustrated in schematic form, the clock selection circuitry of the clock distribution and transmission circuitry receives a clock mesh of the clock mesh fabric which transmits a mesh clock signal to the logic tile that may be available to the circuitry of the logic tile via selectively enabling the output of the multiplexer(s)—as illustrated in FIG. 3A; however, in these embodiments, the clock distribution and transmission circuitry includes a plurality of inputs and outputs for each of the clock paths wherein the plurality of input and output paths each include more than one input/output and u-turn circuit; that is, in this exemplary embodiment, the u-turn circuit includes one or more buffers with their associated wire/conductor routing which, in whole or in part, may be employed in the clock signal distribution path to generate a tile clock signal (having the desired, appropriate or programmable skew relative to the tile clock signals of other logic tiles) that may be responsively selected (via the multiplexer—see FIG. 3B) as the Tile Clock (i.e., a local clock for that logic tile); as noted above, the Tile Clock may be employed by, for example, logic circuitry (and/or memory) to implement functions or operations of the associated logic tile and/or synchronize communication with other logic tiles and/or the external inputs and outputs of the programmable/configurable logic circuitry; in these embodiments, tile clock signals are generated having a desired or programmable skew and, in addition a clock mesh of the clock mesh fabric transmits a mesh clock signal to the logic tile that may be available to the circuitry of the logic tile via selectively enabling the output of the multiplexer(s) (not illustrated); such multiplexers, in this embodiment, responsively output either the mesh clock signal or one or more of an internally generated/derived clock signals as a tile clock which is used by the circuitry of the logic tile to perform or execute, for example, functions and/or operations; control circuitry (for example, in the logic tile and/or outside of the logic tile array—see "Control Circuitry" in FIG. 1) may control such multiplexer(s) and thereby control or determine the use of the one or more clocks (e.g., mesh clock signal and/or one or more internally generated/derived clock signals) in the logic tile.
Figure 3C:
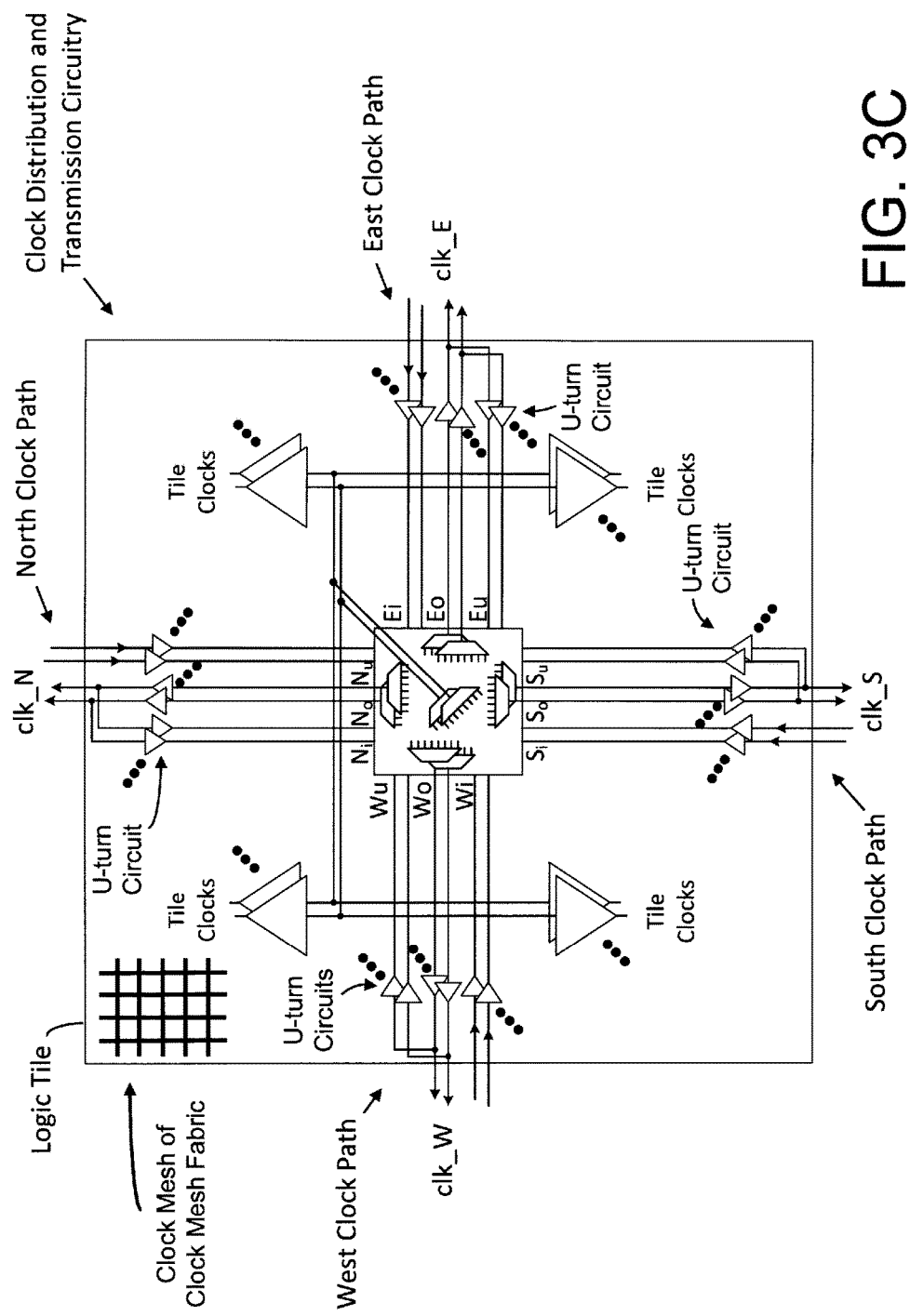

Notably, with reference to FIGS. 3A-3C, the clock distribution and transmission circuitry of the logic tiles, in one embodiment, receives a mesh clock signal (via the clock mesh of the clock mesh fabric) as well as generates a tile clock signal via delay matching (using or based on a clock signal received from one of the plurality of output clock paths of another logic tile (e.g., a neighboring or adjacent logic tile). In addition, the clock distribution and transmission circuitry distributes or transmits the logic tile clock or a related clock signal to one or more neighboring logic tiles of the programmable/configurable logic circuitry via one or more of the clock paths. The clock distribution and transmission circuitry of a logic tile, in one embodiment, includes a plurality of output paths (four paths in this illustrated embodiment—labeled "north clock path", "east clock path", "south clock path" and "west clock path") to generate tile clock signals having a desired or programmable skew and, in certain situations, to distribute or transmit one or more logic tile clocks or related clock signals to one or more neighboring logic tiles of the array of logic tiles. Notably, in the exemplary embodiment of FIG. 3A, each of the four clock path has one tile output clock, one tile input clock, and one tile u-turn circuit; whereas in the exemplary embodiment of FIGS. 3B and 3C, each of the four clock path has two or more tile output clocks, two or more tile input clocks, and two or more tile u-turn circuits.

In one embodiment, each clock path includes a plurality of transistors (configured and illustrated, in the exemplary embodiment of FIGS. 3A-3C, as a plurality of buffers). Here, the clock distribution and transmission circuitry includes one or more u-turn circuits which may be selectively incorporated into the clock signal distribution path of the logic tile to generate a tile clock signal having the desired or programmable skew (for example, substantially no or zero skew) and/or phase (for example, 0 degrees or 180 degrees) relative to the tile clock signals of other logic tiles of the programmable/configurable logic circuitry of an integrated circuit. In this exemplary embodiment, a u-turn circuit is disposed at each of the output paths to provide flexibility in design and layout of the architecture for clock generation of one, some or all of the logic tiles of the programmable/configurable logic circuitry. The u-turn circuits in the logic tile may consist of the same or different type circuits or elements—for example, the u-turn circuit of a first output path may consist of one buffer and the u-turn circuit of a second output path may consist of two or more buffers. However, it may be advantageous to construct the u-turn circuits with the same type of circuits (for example, buffers and associated conductors) and/or the same or similar electrical characteristics as the input and output paths. In this way, it may facilitate delay matching of the clock signals from logic tile to logic tile. For example, it may be advantageous to design paths having the same resistive and capacitive loading, the same wire length and shielding, the same type of clock buffers, and the same transistors of such clock buffers to more fully match the delay of the clock signals from logic tile to logic tile. Notably, although in the illustrative embodiments a u-turn circuit is located at all of the output paths of a logic tile, one or more logic tiles may include output paths that do not include u-turn circuits at one, some or all of the output paths.

Figure 5:
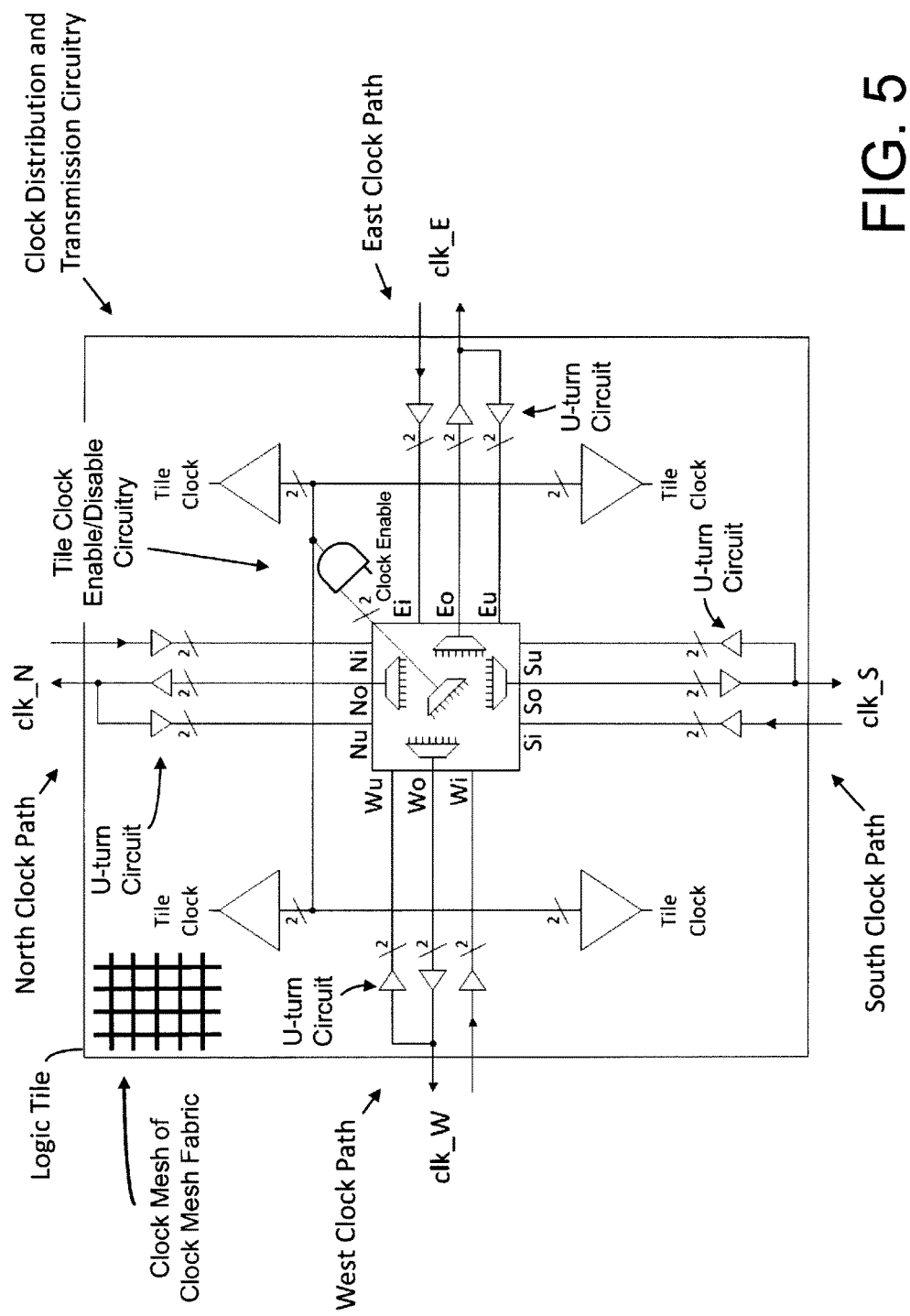
FIG. 5 illustrates in a schematic block diagram form, an exemplary embodiment of clock distribution and transmission circuitry of a logic tile wherein in this exemplary embodiment, although not illustrated in schematic form, the clock selection circuitry of the clock distribution and transmission circuitry receives a clock mesh of the clock mesh fabric which transmits a mesh clock signal to the logic tile that may be available to the circuitry of the logic tile via selectively enabling the output of the clock select multiplexer(s)—as illustrated in FIG. 3A; in addition, the clock distribution and transmission circuitry further includes tile clock enable/disable circuitry to responsively enable or disable generation and/or output of a local tile clock (i.e., Tile Clock) for the logic tile (which, as discussed herein, may be employed by, for example, logic circuitry (and/or memory) to implement functions or operations of the associated logic tile and/or synchronize communication with other logic tiles and/or the external inputs and outputs of the programmable/configurable logic circuitry); in one embodiment, the local tile clock may be driven from the clock mesh fabric and/or, in another embodiment by the one or more additional clock signals generated by the timing circuitry within the tile (see the clock select multiplexers in FIG. 3A); control circuitry (for example, in the logic tile and/or outside of the logic tile array (e.g., see FIG. 1)) may generate one or more control signals to control such tile clock enable/disable circuitry; although in this illustrative embodiment, the tile clock enable/disable circuitry is an AND logic gate, any logic or circuitry may be employed to responsively enable or disable generation and/or output of a local tile clock; notably, in those instances where/when the logic tile employs the mesh clock signal, the tile clock enable/disable circuitry may disable generation and output of the local tile clock (which is generated from or using the transmitted/distributed and delay matched clock signals input to logic tiles on one or more peripheries of the array)

In addition, in one embodiment, with reference to FIG. 5, the clock distribution and transmission circuitry of the logic tiles may also include tile clock enable/disable circuitry to responsively enable or disable generation of tile clock signal and/or output of a tile clock signal to the clock selection circuitry of the logic tile (which, as discussed herein, may be a delay matched clock (relative to similar clocks of the other logic tiles). In one embodiment, the tile clock enable/disable circuitry disables the clock signal that is applied to an input of the clock selection circuitry of the logic tile. For example, in the illustrative embodiment, the tile clock enable/disable circuitry may be an AND logic gate wherein the tile clock signal is applied to one of the inputs of the AND logic gate and a control signal is applied to another input of the AND logic gate. The output of the AND logic gate is applied to the clock selection circuitry of the logic tile which, as indicated above, selects the signal to employ as the tile clock of the logic tile.

The tile clock enable/disable circuitry, in one embodiment, is controlled by control circuitry—for example, in the logic tile and/or outside of the logic tile array. In one embodiment, one or more control signals are applied to the tile clock enable/disable circuitry in order to disable the generation of and/or output of a tile clock signal; here the default of the circuitry is to enable the generation of and/or output of a local tile clock. Notably, although in this illustrative embodiment, the tile clock enable/disable circuitry is an AND logic gate, any logic or circuitry may be employed—all of which are intended to fall within the scope of the present inventions.

In addition thereto, or in lieu thereof, the clock distribution and transmission circuitry of the logic tiles may include mesh clock enable/disable circuitry to responsively enable or disable providing the mesh clock signal to an input of the clock selection circuitry of the logic tile. The mesh clock enable/disable circuitry employed in relation to the mesh clock signal may also be an AND logic gate wherein the mesh clock signal is applied to one of the inputs of the AND logic gate and a control signal is applied to another input and the output of the AND logic gate is applied to the clock selection circuitry of the logic tile. Notably, as indicated above in connection with the delay matched clock signal, the mesh clock enable/disable circuitry may employ any logic or circuitry may be employed—all of which are intended to fall within the scope of the present inventions.

For the avoidance of doubt, the clock distribution and transmission circuitry of the logic tiles of any and all of the embodiments described and/or illustrated herein may include tile clock enable/disable circuitry. For the sake of brevity, a separate discussion/illustration of each embodiment implementing such clock distribution and transmission circuitry is not provided; however the implementation is clear to one of ordinary skill in the art based on the instant disclosure. For example, the clock mesh and related circuitry may be implemented in conjunction with the tile clock enable/disable circuitry of FIG. 5 such that, in one embodiment, when the logic tile employs the mesh clock, the tile clock enable/disable circuitry may disable generation and output of the local tile clock (which is generated from or using the transmitted/distributed and delay matched clock signals).

The term "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

The memory which stores the data, equations, relationships, and/or look up table(s) may be a permanent, semi-permanent or temporary (i.e., until re-programmed) storage that is discrete or resident on (i.e., integrated in), for example, the control circuitry. In connection with this invention, the memory may store the programmable skew relationship (whether zero or non-zero) between the tile clock signals and/or tile clocks of the logic tiles of the programmable/configurable logic circuitry. As such, in one embodiment, the memory may be one time programmable, or data, equations, relationships, and/or look up table(s) employed by the control circuitry may be one time programmable (for example, programmed during test or at manufacture). In another embodiment, the memory is more than one time programmable and, as such, the predetermined values, relationships and/or limits employed by the control circuitry may be modified after test and/or manufacture.

Notably, the u-turn circuits have been described as consisting of buffers. However, the u-turn circuits may be comprised of any active or passive element now known or later developed which may be employed to generate a desired or programmable skew and/or phase relative to the tile clock signals of other logic tiles of the programmable/configurable logic circuitry of an integrated circuit. For example, in one embodiment, one or more conventional-type buffers may be employed.

As mentioned above, the techniques described herein may be implemented using one or more processors (suitably programmed) to perform, execute and/or assess one or more of the functions or operations described herein to generate clock signal distribution and transmission networks or architectures of the inventions.

Notably, various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, and/or wired signaling media. Examples of transfers of such formatted data and/or instructions by carrier waves include, but are not limited to, transfers (e.g., uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations using computer aided design and/or testing tools. The simulation of the charging circuitry, control circuitry and/or monitoring circuitry, and/or techniques implemented thereby, may be implemented by a computer system wherein characteristics and operations of such circuitry, and techniques implemented thereby, are imitated, replicated and/or predicted via a computer system. The present inventions are also directed to such simulations of the inventive charging circuitry, control circuitry and/or monitoring circuitry, and/or techniques implemented thereby, and, as such, are intended to fall within the scope of these inventions. The computer-readable media corresponding to such simulations and/or testing tools are also intended to fall within the scope of these inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as "exemplary" is not to be construed as preferred or advantageous, for example, over other embodiments or implementations; rather, it is intended convey or indicate the embodiment or embodiments are example embodiment(s).

Finally, although the present inventions have been described in certain specific aspects, many additional modifications and variations would be apparent to those skilled in the art. It is therefore to be understood that the present inventions may be practiced otherwise than specifically described without departing from the scope and spirit of the present invention. Thus, embodiments of the present inventions should be considered in all respects as illustrative and not restrictive.

The terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item.

Further, the term "logic tile" means a design unit or block of a plurality of transistors (typically more a tens of thousand) that are connected or configured, for example, into programmable components (e.g., programmable logic components), which, in this application, is capable of connecting to one or more neighboring "logic tiles" (for example, in or during operation). The term (i) "integrated circuit" means, among other things, a processor, controller, state machine, gate array, SOC, PGA and/or FPGA.

In addition, the term "data" may mean, among other things, a current or voltage signal(s) whether in analog or a digital form (which may be a single bit (or the like) or multiple bits (or the like)).

The terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus. Use of the terms "connect", "connected", "connecting" or "connection" throughout this document should be broadly interpreted to include direct or indirect (e.g., via one or more conductors and/or intermediate devices/elements (active or passive) and/or via inductive or capacitive coupling)) unless intended otherwise (e.g., use of the terms "directly connect" or "directly connected").

What is claimed is:

1. An integrated circuit comprising:
    an array of logic tiles wherein each logic tile is configurable to connect with at least one logic tile that is adjacent thereto;
    a clock mesh fabric including a clock mesh to provide a mesh clock signal to each of the logic tiles of the array of logic tiles; and
    wherein each logic tile of the array of logic tiles includes:
        clock distribution and transmission circuitry configurable to provide an associated tile clock to circuitry which performs operations using or based on the associated tile clock, wherein the clock distribution and transmission circuitry includes:
            tile clock generation circuitry to generate a tile clock signal having a skew, wherein the skew of the tile clock signal is balanced with respect to the tile clock signals generated by the tile clock generation circuitry of each logic tile of the array of logic tiles, and
            clock selection circuitry, coupled to the clock mesh and the tile clock generation circuitry, to receive the mesh clock signal and the tile clock signal and responsively output the associated tile clock of the associated logic tile to the circuitry which performs operations using or based on the associated tile clock, wherein the associated tile clock corresponds to the mesh clock signal or the tile clock signal.

2. The integrated circuit of claim 1 wherein:
the array of logic tiles receives an external clock signal;
each logic tile of the array of logic tiles further includes:
 at least one input clock path, wherein the input clock path includes circuitry which is configurable to receive an input clock signal, and
 a plurality of output clock paths, wherein each output clock path includes circuitry which is configurable to transmit a tile output clock signal to one or more logic tiles of the array of logic tiles which is/are adjacent thereto; and
wherein the tile clock generation circuitry of each logic tile is coupled in the input clock path of the associated logic tile to receive (i) the external clock signal or (ii) a delayed version of the external clock signal from one of the plurality of output clock paths of an adjacent logic tile.

3. The integrated circuit of claim 2 wherein each output clock path of the plurality of output clock paths of each logic tile of the array of logic tiles includes at least one u-turn circuit.

4. The integrated circuit of claim 3 wherein the at least one of the u-turn circuit includes one or more buffers.

5. The integrated circuit of claim 1 wherein the clock selection circuitry of each logic tile of the array of logic tiles includes a clock select multiplexer to receive the mesh clock signal at a first input and the tile clock signal at a second input and responsively output the tile clock.

6. The integrated circuit of claim 5 wherein the clock select multiplexer further receives one or more input control signals to determine which input of the clock select multiplexer is connected to the output of the clock select multiplexer.

7. The integrated circuit of claim 1 wherein the tile clock generation circuitry of each logic tile of the plurality of logic tiles includes one or more buffers.

8. An integrated circuit comprising:
a plurality of logic tiles, wherein each logic tile is configurable to connect with at least one logic tile that is adjacent thereto, and
clock mesh fabric including a clock mesh to provide a mesh clock signal to each of the logic tiles of the plurality of logic tiles; and
wherein each logic tile of the plurality of logic tiles includes:
 at least one input clock path, wherein the input clock path includes circuitry which is configurable to receive an input clock signal,
 a plurality of output clock paths, wherein each output clock path includes circuitry which is configurable to transmit a tile output clock signal to one or more logic tiles of the plurality of logic tiles which is/are adjacent thereto,
 tile clock generation circuitry, coupled to the input clock path, configurable to generate a tile clock signal, having a skew, using the input clock signal wherein the skew of the tile clock is balanced with respect to the tile clocks generated by the tile clock generation circuitry of each logic tile of the plurality of logic tiles,
 clock selection circuitry, coupled to the clock mesh and the tile clock generation circuitry, to receive the mesh clock signal and the tile clock signal and responsively output a tile clock of the associated logic tile wherein the tile clock signal corresponds to the mesh clock signal or the tile clock signal, and
 circuitry, coupled to the tile clock generation circuitry, to perform operations using or based on the tile clock; and
wherein:
 the plurality of logic tiles includes a first logic tile to receive a first external clock signal at an input of the associated at least one input clock path, and
 tile clock generation circuitry of each logic tile of the plurality of logic tiles generates the tile clock signal using (i) the first external clock signal received by the first logic tile or (ii) a delayed version of the first external clock signal from one of the plurality of output clock paths of a logic tile in the first plurality of logic tiles.

9. The integrated circuit of claim 8 wherein each output clock path of the plurality of output clock paths of each logic tile of the plurality of logic tiles includes at least one u-turn circuit.

10. The integrated circuit of claim 9 wherein the at least one of the u-turn circuit includes one or more buffers.

11. The integrated circuit of claim 8 wherein the tile clock generation circuitry of each logic tile of the plurality of logic tiles includes one or more buffers.

12. The integrated circuit of claim 8 wherein the clock selection circuitry of each logic tile of the plurality of logic tiles includes a clock select multiplexer to receive the mesh clock signal at a first input and the tile clock signal at a second input and responsively output the tile clock.

13. The integrated circuit of claim 12 wherein the clock select multiplexer further receives one or more input control signals to determine which input of the clock select multiplexer is connected to the output of the clock select multiplexer.

14. The integrated circuit of claim 13 wherein the on or more input control signals are stored in memory and applied to the clock select multiplexer during initialization of the plurality of logic tiles.

15. The integrated circuit of claim 8 further including an array of logic tiles including a plurality of rows of logic tiles and columns of logic tiles wherein the plurality of logic tiles is a portion of the array of logic tiles.

16. The integrated circuit of claim 8 wherein the plurality of logic tiles are organized in an array including a plurality of rows and/or columns of logic tiles.

* * * * *